United States Patent [19]
Muskatevc

[11] Patent Number: 6,087,579
[45] Date of Patent: Jul. 11, 2000

[54] METHOD AND APPARATUS FOR DIRECTING SOLAR ENERGY TO SOLAR ENERGY COLLECTING CELLS

[76] Inventor: Mark S. Muskatevc, 2006 N. 119 St., Wauwatosa, Wis. 53226

[21] Appl. No.: 09/035,451

[22] Filed: Mar. 5, 1998

Related U.S. Application Data

[60] Provisional application No. 60/041,212, Mar. 26, 1997.

[51] Int. Cl.[7] .................. H01L 31/048; H01L 31/052; H01L 31/058
[52] U.S. Cl. ..................... 136/251; 136/246; 136/248
[58] Field of Search ..................... 136/245, 246, 136/248, 251

[56] References Cited

U.S. PATENT DOCUMENTS

| | | | |
|---|---|---|---|
| 3,152,926 | 10/1964 | Power | 136/246 |
| 3,419,434 | 12/1968 | Colehower | 136/246 |
| 3,627,585 | 12/1971 | Dollert et al. | 136/245 |
| 4,200,472 | 4/1980 | Chappell et al. | 136/246 |
| 4,395,582 | 7/1983 | Damsker | 136/248 |
| 4,410,757 | 10/1983 | Stamminger et al. | 136/248 |
| 4,933,020 | 6/1990 | Wenzel | 136/246 |
| 5,009,243 | 4/1991 | Barker | 136/246 |
| 5,344,497 | 9/1994 | Fraas et al. | 136/246 |
| 5,437,735 | 8/1995 | Younan et al. | 136/251 |
| 5,520,747 | 5/1996 | Marks | 136/245 |
| 5,538,563 | 7/1996 | Finkl | 136/246 |

FOREIGN PATENT DOCUMENTS

| | | | |
|---|---|---|---|
| 59-231358 | 12/1984 | Japan | F24J 3/02 |
| 2054826 | 2/1981 | United Kingdom | F24J 3/02 |

*Primary Examiner*—Bernard Codd
*Attorney, Agent, or Firm*—Andrus, Sceales, Starke & Sawall

[57] ABSTRACT

A photovoltaic array includes a plurality of generally planar cells, arranged in panels, a light collecting body having a solar energy collecting surface adapted to be oriented for receiving solar energy in a nominal direction which defines a nominal light source direction. The panels are spaced apart from each other in a direction perpendicular to the nominal light source direction and each has an active surface oriented on the body at an angle of less than 90° relative to the nominal light source direction. The light collecting body is transmissive for redirecting light received on the light collecting surface onto the active surfaces of the panels.

17 Claims, 8 Drawing Sheets

METHOD AND APPARATUS FOR DIRECTING SOLAR ENERGY TO SOLAR ENERGY COLLECTING CELLS

RELATED APPLICATION

This application relates to Provisional Application Ser. No.: 60/041,212 filed Mar. 26, 1997.

FIELD OF THE INVENTION

This invention relates to photovoltaic cells and more particularly to a high efficiency photovoltaic cell.

BACKGROUND PRIOR ART

Solar energy cells are a safe, non-polluting, inexhaustible source of energy. These generally take the form of a flat panel collector array orientated generally perpendicularly to the sun's rays. However, because of the relatively low power output of such systems, their use has been generally limited to such remote applications as control systems, small electric motors and lighting in remote areas where conventional energy sources are not readily available. Because of the limited output of conventional prior art solar cell systems, most efforts regarding their use involves attempts to reduce the power requirements of devices which rely on solar energy and increasing the output of the cells by increasing the quality of the materials used. However, in many such applications, space limitations often limit the number of panels that can be employed in a particular location.

One attempt to render solar cells more efficient includes orienting a plurality of bi-facial solar cells parallel to the incident solar rays and positioning reflectors therebetween for redirecting solar radiation onto the surfaces of the cells, such as that disclosed in U.S. Pat. No. 5,538,563.

SUMMARY OF THE INVENTION

The invention provides photovoltaic cell array and solar collector and concentrator. The solar energy collector and concentrator is provided that can be used in applications that have limited space for solar panels. Additionally, the invention provides a solar collector that allows for the efficient collection of solar energy.

One embodiment of the invention includes a solar energy collector and a plurality of solar cells each having a reactive cell surface. An optic medium is disposed between the solar cells and is adapted to receive and redirect solar energy into the reactive cell surface.

The invention includes a solar energy collector and a plurality of generally planar photovoltaic panels. Each of the panels has at least one reactive cell surface. According to one embodiment of the invention, the panels are arranged generally parallel to one another and the nominal direction of the solar energy. According to another embodiment of the invention, the panels are arranged at an acute angle relative to the nominal direction of the solar energy. An optic medium envelopes and is disposed between the panels. The optic medium is adapted to concentrate and direct solar energy into the panels. Partially and fully reflective surfaces on the collector concentrate and redirect the light onto the photovoltaic panels.

The invention also includes a method for generating electrical energy from solar energy and including the steps of providing a plurality of generally planar solar panels arranged generally parallel to one another and an optic medium disposed in a surrounding relation to the panels, receiving solar energy in an input surface of the optic medium, and redirecting the solar energy from the input surface through the optic medium and into the panels.

It is a general object of the invention to provide a new and improved photovoltaic array.

Another object of the invention is to provide a photovoltaic array which provides a greater energy output for a given facial surface area.

A further object of the present invention is to provide a photovoltaic array that can be used in applications having limited surface area.

Yet another object of the present invention to provide for a photovoltaic array wherein solar energy is collected and redirected onto the surface of solar panels.

It is a further object of the present invention to provide a photovoltaic array wherein solar energy is enhanced and redirected onto solar cells.

These and other features and advantages of the invention will become apparent upon review of the following detailed description of embodiments of the invention, claims and drawings.

DETAILED DESCRIPTION OF THE EMBODIMENTS

In general terms, the invention comprises a photovaltaic array including a plurality of photovaltaic cells arranged in panels and a solar energy or light collecting body having a solar energy or light collecting surface adapted to be oriented for receiving solar energy or light in a direction which defines a nominal solar energy direction. The panels are arranged in an array which extends in a direction perpendicular to the nominal solar energy direction and the panels are oriented on the light collecting body at an angle of less than 90° relative to the nominal solar energy direction. In the embodiment shown in FIGS. 1–4, the panels are generally parallel to the nominal solar energy direction or, in other words, at an angle of 0°. In the embodiment shown in FIGS. 5–9, the panels are oriented at an acute angle relative to the light source direction and in the embodiment of FIG. 10, the panels are arranged at an angle between the embodiment of FIGS. 1–4 and the embodiment of FIGS. 5–9. The light collecting body is characterized by an ability to refract and redirect the solar energy received at the solar energy collecting surface onto the active surface of the panels.

FIGS. 1–4 show a first embodiment of the invention to comprise a solar module 10 including a solar energy collector 11 and a plurality of photovoltaic panels 12 arranged in a generally parallel relation to each other and to the nominal direction of the solar energy. It would be appreciated that as a result of the earth's rotation, the angle of incidence of the solar energy will vary with the time of day and the elevation of the sun relative to the horizon. Accordingly, the term nominal solar energy direction as used herein means an average angle of incidence of the solar energy or light. Also, for purposes of discussion, it is assumed that the solar module 10 of FIGS. 1–4 and 110 of FIGS. 5–9 are oriented so that they are symmetrical relative to a plane containing the average angle of incidence.

Panels 12 may comprise one or more individual solar cells 14 depending upon the size of the module and the geometries of the system and each cell has at least one active cell surface 16 for collecting energy. A suitable solar cell 14 which may be used in the embodiments of the invention is Kyocera type PSC100H. Such cells may typically have maximum output of about 0.47 volts and 2.87 amps and a maximum power output of about 1.35 watts. In the embodiment illustrated in FIGS. 1–4, there are 3 cells arranged end to end in two rows which are electrically connected in series. The active surfaces 16 of the cells 14 in each panel 12 are oriented in the same direction. The cells 14 in each row are separated by spacers 22 and spacers 24 and 26 are disposed at the upper and lower edges of the rows of cells. Preferably, all of the spacers are colored white so that they do not absorb light energy. Leads 28 are connected to each of the panels 12 for electrically connecting the cells to the load or system being energized. It will be appreciated that while a specific number of cells are illustrated in the embodiment of FIGS. 1–4, any number may be employed depending upon the size and geometries of the system and the power requirements.

The module 10 also includes an optic medium 30 composed of an optic material that is disposed between the active surfaces of the panels. As used herein, optic material means substantially optically transparent material that is machineable, moldable or shapeable into structures in accordance with the invention. It is preferable that the optic material be plastic, glass or silicon fibre but other materials are also usable. One material found to be acceptable is a cast acrylic supplied by Athoaas, model Plexiglass G. In the embodiments of the invention, this material is molded into the indicated shapes.

The optical medium 30 includes a solar energy or light collecting surface 31 positioned to receive solar energy and defining the upper margin of a web 32. A plurality of fins 34 extend downwardly in a parallel relation from the web 32 and fill the spaces between the panels 12. There is also a pair of exterior fins 35 and 36 extending downwardly from the web 32 on each end of the module 10. A first surface 38 of each of the interior fins 34 and end fin 35 contacts the front or active surface 16 of the adjacent panel 12 and a second surface 39 of each interior fin 34 and the other end fin 36 contacts the rear or inactive surface. The outer surfaces of fins 35 and 36 define end surfaces 44, the lower ends and sides of the fins define a lower surface 40 and side surfaces 46, respectively.

Figure 1:
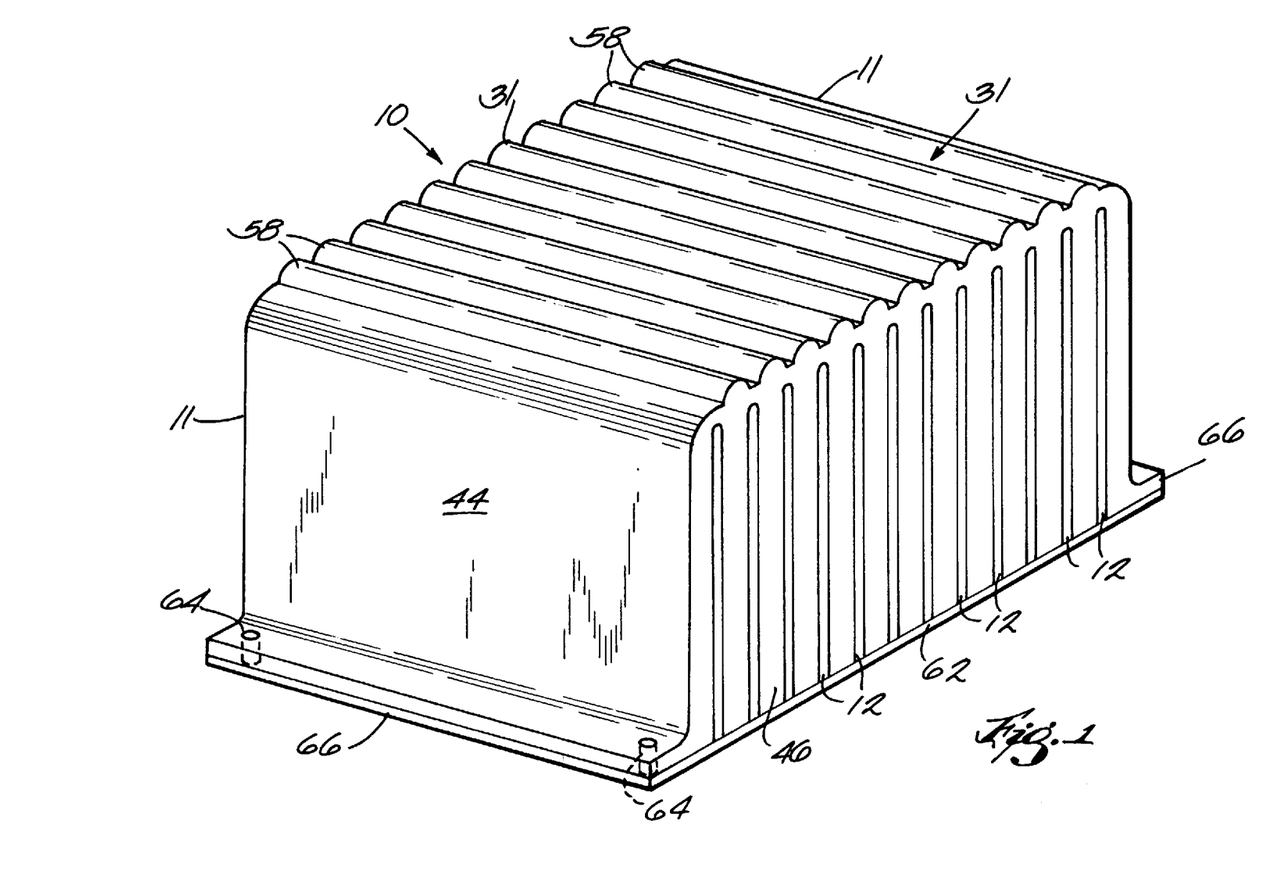
FIG. 1 is a perspective view of a solar module embodying the present invention.
Figure 2:
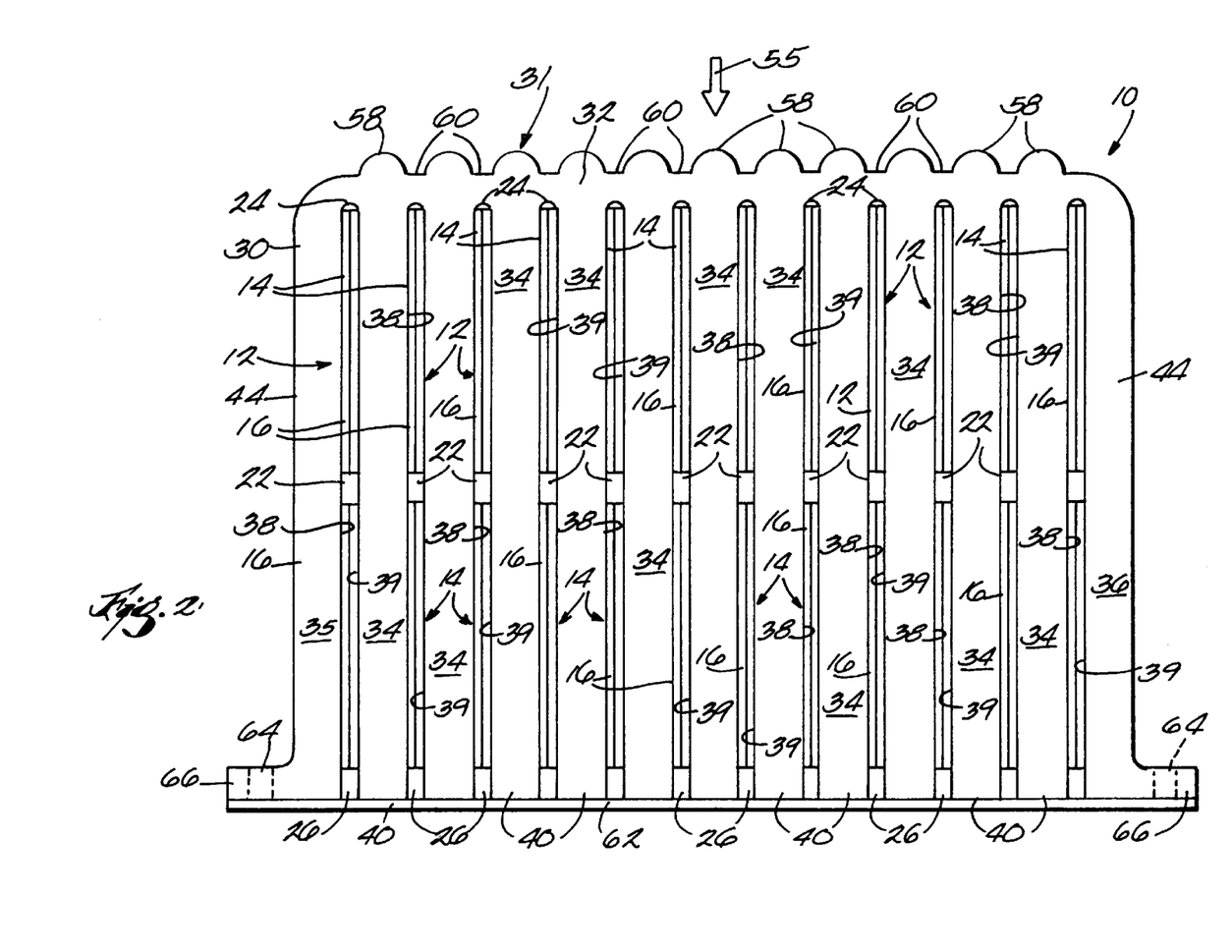
FIG. 2 is a side view of the module of FIG. 1.
Figure 3:
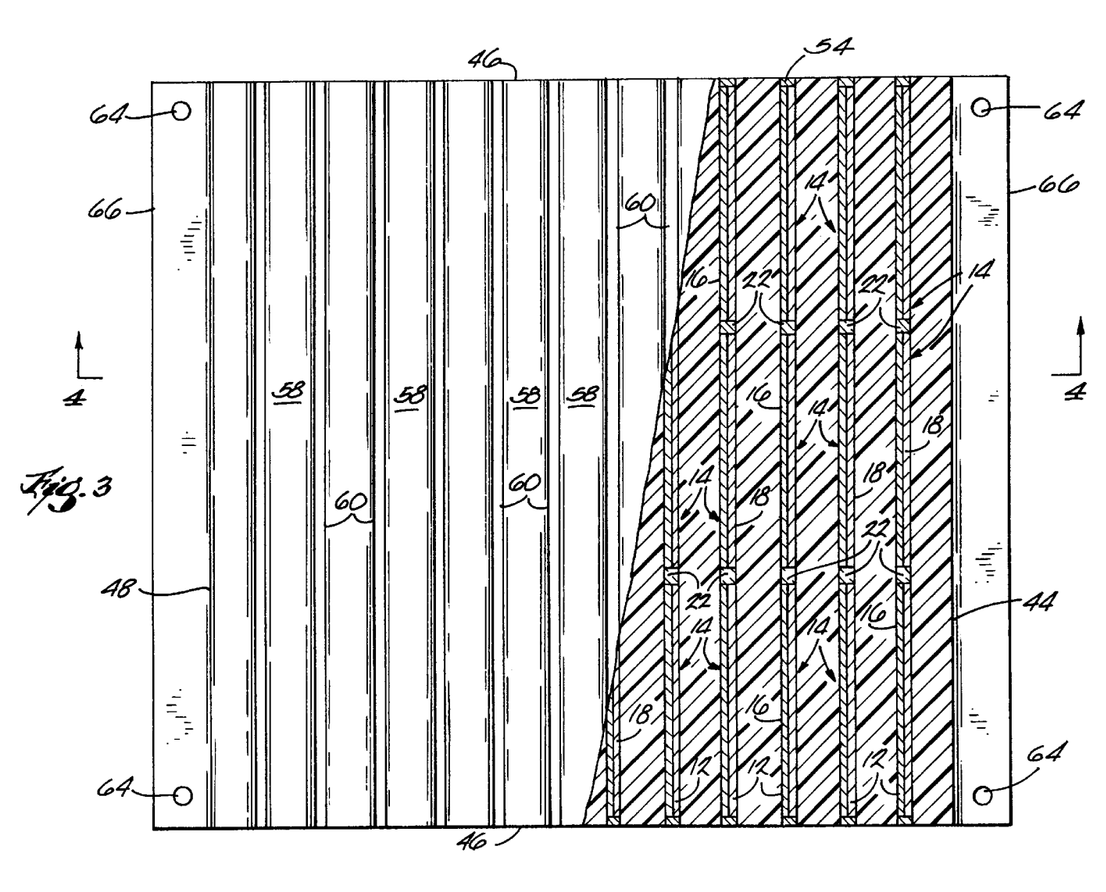
FIG. 3 is a partial sectional top view of the module of FIG. 1.

The configuration of the fins 34 positions the panels parallel to the nominal solar energy direction 55 which in FIG. 2 is shown to be perpendicular to the solar energy receiving surface 32. The panels 12 also extending in a first direction generally perpendicular to the nominal solar energy direction. In addition, the panels 12 are spaced apart along a horizontal line which is also perpendicular to the nominal solar energy direction and also the first direction.

A solar energy collecting surface 31 defines the upper margin of the web 32 and includes a plurality of solar energy collecting sub-surfaces 58 which are arcuate in transverse cross section and extend in the first direction and parallel to the panels 12. The sub-surfaces 58 are disposed in the gap between the upper edges of the panels 12 and there is a flat area 60 between each of the sub-surfaces 58 and located above the upper edges of the panels 12 and are generally perpendicular to the nominal solar energy direction 55.

The side surfaces 46, end surfaces 44, the lower surface 40, the upper edge 58 of the panels 12 and fin side surfaces 39 are all preferably treated such as by roughening so as to diffuse the solar energy. Alternatively they may be coated with a partially or substantially totally reflective film made up of reflective material. As used herein, "reflective material" includes any material that can be used to coat the surfaces of the optic material to form a substantially light reflective surface. Suitable reflective material may include: reflective colored paints, such as white gloss, glass bead silver, glass bead chrome, mirrors, polished metals, or any other reflective material known in the art. The reflective material can be glued, vacuum sealed, silk screened, or applied between two pieces of clear plastic film and laminated onto the surface of the medium to form the reflective film. It is preferable that reflective colored paints, such as white gloss, glass bead silver, or glass bead chrome, be used and silk screened onto the surfaces of the optic medium to form the reflective film. The reflective film can be applied during or after the molding or forming of the optical medium 30.

The fin side surfaces 38 which abuts the active surface of the adjacent panel 12 and the convex sub-surfaces 58 of the solar energy collecting surface 56 are also treated so as to diffuse the solar energy. Alternatively they may be coated with a film which is partially reflective and partially conductive of solar energy. The partially conductive film may include any material that can be applied to the surfaces of the optic material and which allows most of the solar energy travelling in one direction to pass, and which also reflects most of the solar energy travelling in the opposite direction. Generally, the partially reflective film can be made up of the same reflective material as the totally reflective film, but the medium 30 by any suitable fastening device which extends through openings 64 in flanges 66. Base plate 62 acts to hold the solar panels 12 in place within the medium 30. The flanges 66 may be omitted and the plate through openings in the module so that spacing between modules can be minimized. The entire module 10 can be enclosed in a weather tight housing (not shown), the design of which will prevent interference with the absorbing of solar energy. The design of the enclosure will be determined by the application for which the solar module 10 will be used.

In operation, the module 10 is placed in a position such that the input surface 31 is exposed to solar radiation and preferably is oriented so that surface 31 is generally perpendicular to the nominal energy source direction. Direct and ambient solar radiation enters the module through the solar energy collecting surface 31 including the flat areas 60 and the one-way reflective coated surfaces 58. The solar energy collecting surface 31, along with the other reflective surfaces in the medium 30 act to direct the solar energy to the solar panels 12. For example, referring to FIG. 4, if solar energy A enters the medium 30 at flat area 60 from one side, the solar energy A is refracted downwardly and onto the reflective surface 39 for redirection onto the active surface 16 of the panel 12. Solar energy B entering at an angle from the other side is refracted downwardly between the panels.

Figure 4:
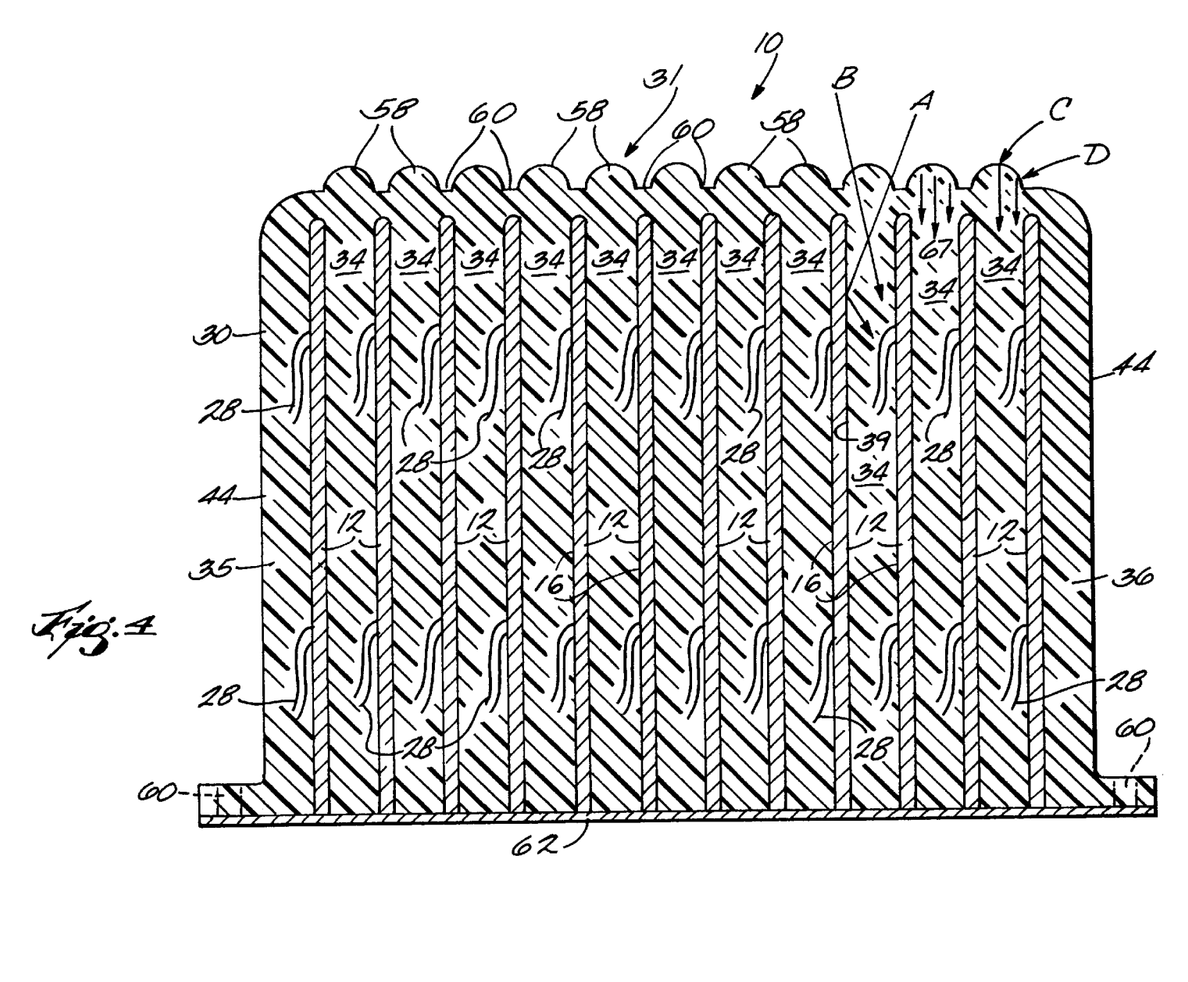
FIG. 4 is a cross sectional view taken along line 4—4, of FIG. 3.
Figure 5:
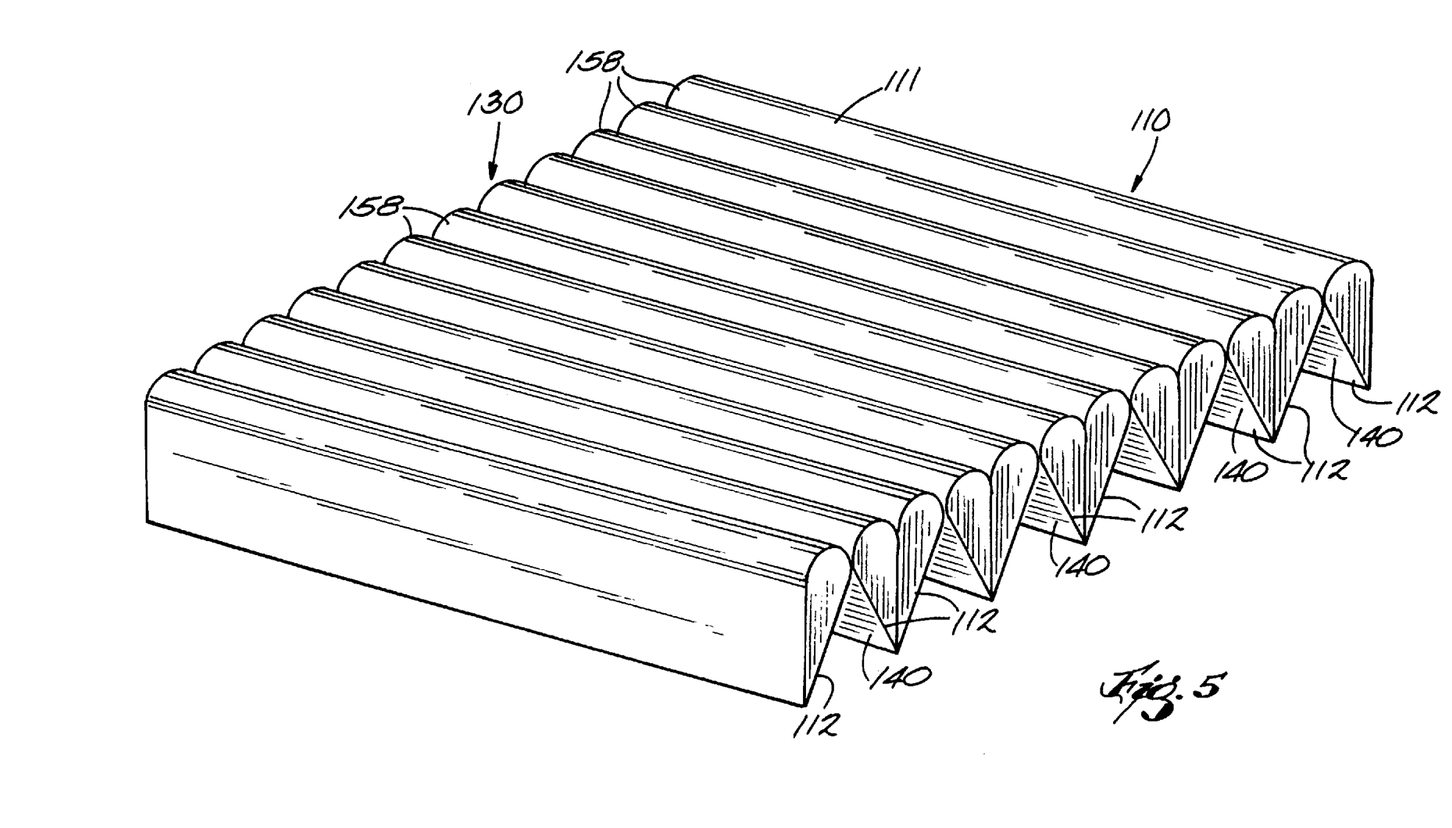
FIG. 5 is a perspective view of a solar module incorporating the preferred embodiment of the invention.

Solar energy C and D entering the convex surfaces 58, is directed downwardly into one of the fins 34. Moreover the surfaces 58 are configured such that it reflects solar energy 67 downwardly in a generally parallel relation.

Once the solar energy enters the fins 34, it may reflect off of a totally reflective side surface 39 into one of the partially reflective side surfaces 38, or it may flow directly to one of the partially reflective side surfaces 38. The partially reflective side surfaces 38 act as a solar energy output surface such that the majority of the solar energy is directed in a generally perpendicular relation onto the reactive surface 16 of the solar panels 12. The remainder of the energy is reflected back towards the reflective side surface 38, which again reflects the remaining energy towards an output surface 38. As the solar energy is reflected down the fins 34, substantially all of the solar energy that enters the fins 34 is directed through the output surface 38 and is absorbed by the solar cells 14.

Both ambient and direct solar energy enters the collecting surface 31, and through the reflective action of the surfaces in directing the energy into the fins, often the reflected solar energy combines with and enhances other solar energy within the optic medium 30. This results in the amplification of the solar energy as it passes through the optic medium 30. As the solar energy is collected by the solar panels 12, the solar energy is converted into electrical energy. The electrical energy is then transferred from the solar panels 12, and collected for use. In some applications, the energy is stored in an electrical energy storage device, such as a battery (not shown). In other applications, the energy is put to immediate use.

In other embodiments of the invention, bifacial solar cells could be used, or solar cells could be placed back to back such that both sides of the panel contain reactive cell surfaces. In such an embodiment, the surfaces 38 and 39 of the fins 34 would all be semi-reflective and act as output surfaces. Additionally, in other embodiments, multiple modules can be interconnected to form an array of solar energy collecting devices.

Figures 6, 9, 10:
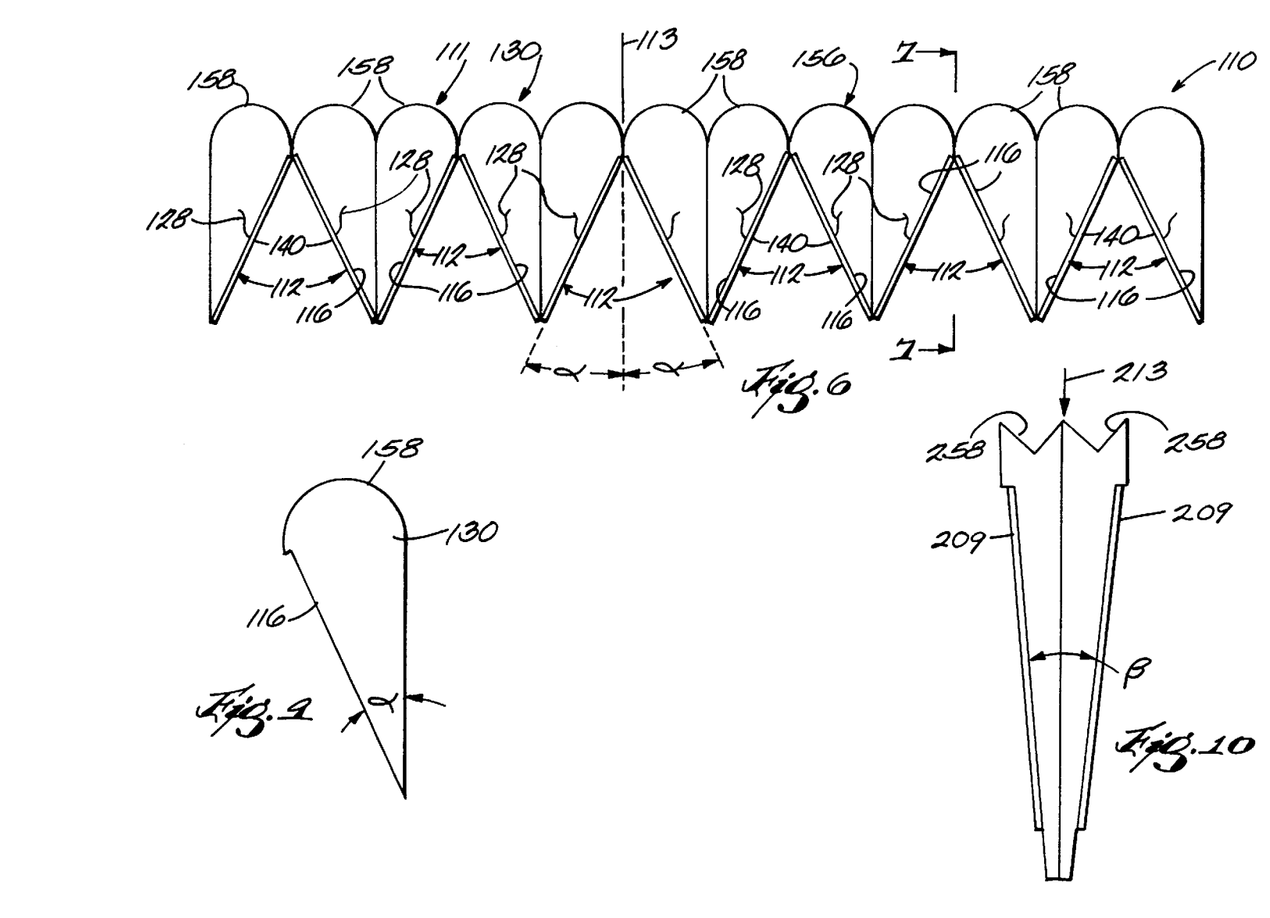
FIG. 6 is an end view of the module shown in FIG. 5.
FIG. 9 is an end view of a portion of the module shown in FIG. 5.
FIG. 10 is a further alternate embodiment of the invention.
Figure 7:
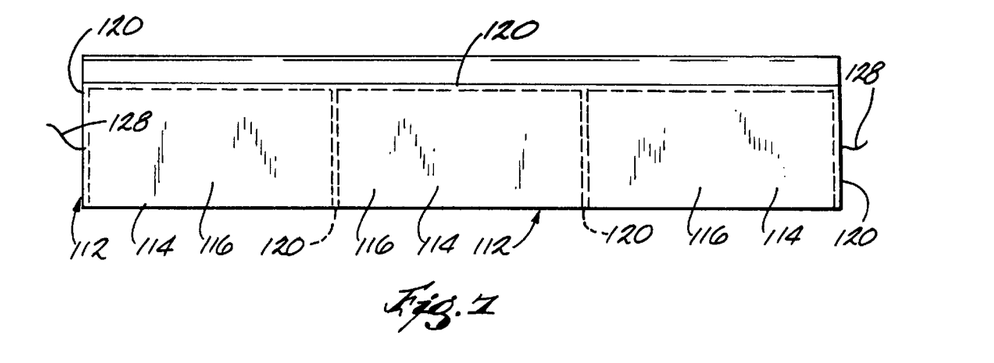
FIG. 7 is a view taken along lines 7—7 of FIG. 6.
Figure 8:
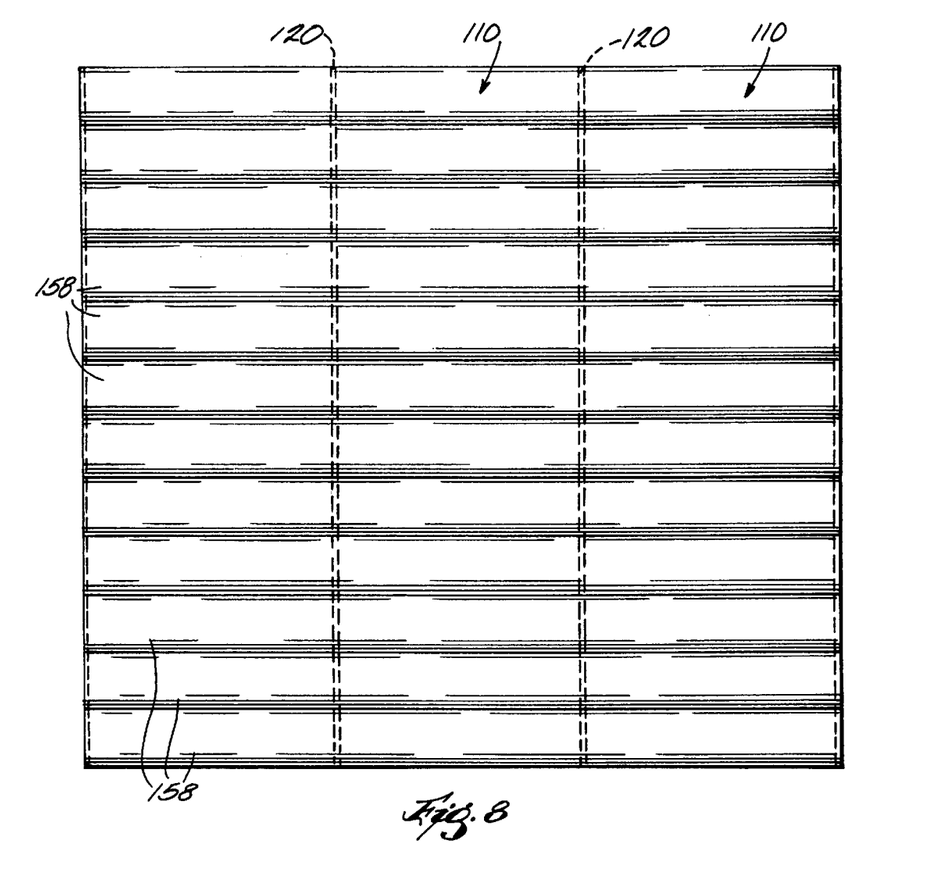
FIG. 8 is a top view of the module shown in FIG. 5.

FIGS. 5–9 show a solar module 110 embodying one preferred embodiment of the invention. The solar module 110 includes a solar energy collector 111 and a plurality of solar panels 112 all arranged at the same acute angle a relative to the nominal direction of solar energy 113. As shown in FIG. 7, the solar panels 112 each includes at least one solar cell 114 having at least one active cell surface 116 for solar energy. One suitable solar cell 114 which may be used is a Kyrocera type PSC100H. Such cells may typically have a maximum output of about 0.47 volts and 2.87 amps and a maximum power output of about 1.35 watts.

In the embodiment FIGS. 5–9, each panel consists of a plurality of cells 114 arranged end to end and electrically connected in series, with spacers 120 disposed between the cells and along the upper, lower and outside edges.

The panels 112 are oriented such that adjacent panels lie in intersecting planes and alternate panels are oriented in parallel planes so that the angle between each adjacent pair of panels forms an angle of α with the nominal solar direction for an angle of 2 α relative to an adjacent panel. Also, the panels 112 extend in a first direction perpendicular to the nominal solar energy direction 113 and are arranged in a row extending in a direction which is perpendicular both to the direction in which the panels extend and the nominal solar energy direction 113. In addition, the active surfaces 116 of the panels 112 are on the side of the panel which faces upwardly and inwardly. As seen in FIGS. 6 and 7, leads 128 are connected to each of the panels 112 for proper electrical connection in accordance with the use of the solar module 110.

The module 110 also includes an optic medium 130 which at least fills the spaces between the active cell surfaces. All of the surface of the medium 130 are clear for transmitting solar energy. The medium 130 may be composed of the same material as discussed with respect to the embodiments of FIGS. 1–4. The back faces 140 each of the panels 112 may be covered by an opaque material and the space between the surfaces 140 may be open for purposes of economy.

A solar energy input surface 156 is provided at the upper end of the optic medium 130 and is subdivided into a plurality of convex sub-surfaces 158 each of which extends in the first direction, which is also the direction in which the panels 112 extend. Each of the sub-surfaces 158 may be generally parabolic in cross-section and each has an end adjacent to the upper edge of each panel and a second edge in a plane which bisects the angle formed by the lower edges of the adjacent panels and which is parallel to the energy source direction 113. This provides one of the sub-surfaces 158 above each of the panels 112.

In operation, the module 110 is positioned such that the input surface 156 is exposed to solar radiation. Direct and ambient solar radiation enters the module 110 through the solar energy collecting surface 156. The sub-surfaces 158 tend to refract the solar energy downwardly onto the active surfaces 116 of the solar panels 112. It has been found that the energy output from the configuration shown in FIGS. 5–9 provides about twice the power output for a given input surface area than a conventional solar panel array having the same input area. Facial surface area as used herein means the area defined by the length and width of the module 110 as viewed in FIG. 8.

The angle α between each panel and the nominal direction of the solar energy 113 is determined by the number of solar panels 112 that are desired to be positioned within the module 110 having a given facial surface area. By decreasing the angle α, the number of solar panels 112 increase for a given facial area. Since the number of panels 112 not only increase the output but also the cost, there is a power-expense trade off.

FIG. 10 shows an alternate embodiment of the invention wherein the solar panels 209 are positioned at an angle β relative to the nominal solar energy direction 213. The angle β is smaller than the angle α and permits the use of a larger number of solar panels 209. The size of the angle between solar panels is inversley related to the number of panels. Also, the sub-surfaces 258 in the embodiment of FIG. 10, consists of V-shaped grooves for receiving and refracting solar energy.

Figure 11:
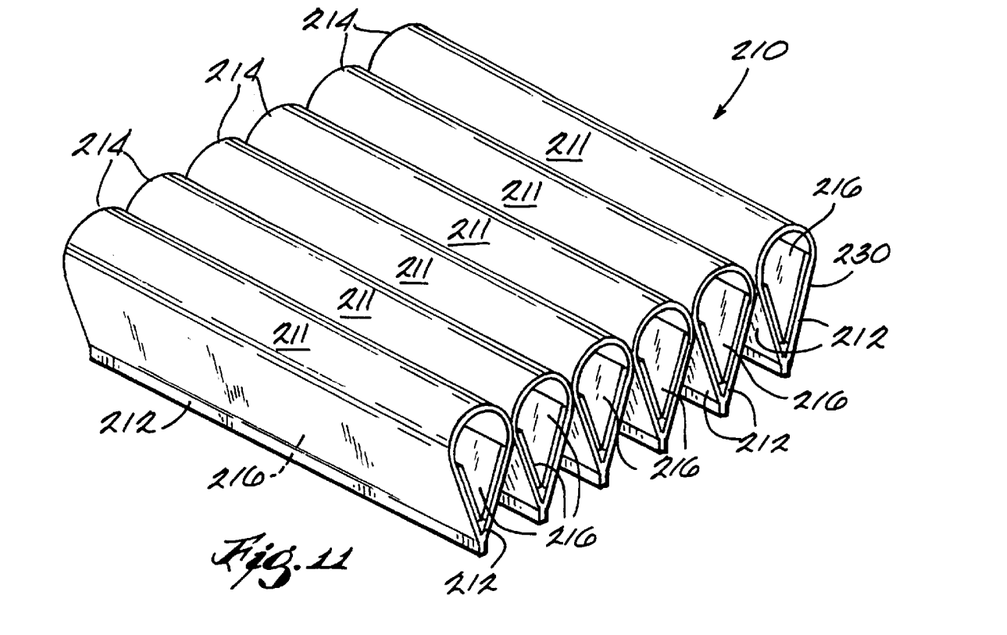
FIGS. 11 and 12 show alternate embodiments of the invention.

FIG. 11 is a perspective view of a preferred embodiment of the invention and is similar to the embodiment of FIGS. 5–9 except that the solar energy collector 210 consists of a plurality of hollow bodies 211 joined in a side-by-side relation and each having a pair of sidewalls 212 formed at an angle of 2α relative to each other. The side of the bodies 211 opposite the junction of the sidewalls 212 comprises an arcuate solar collector 214 which is generally parabolic in transverse cross section and is composed of the same optic material which is transparent to solar energy as discussed with respect to the embodiments of FIGS. 1–4. A solar panel 216, such as that discussed with respect to FIGS. 5–9, is positioned on the inner surface of each of the side walls 212 and with their active surfaces facing inwardly. The ends of the bodies 211 may be closed and the hollow interior may be filled with a clear liquid, such as water, or an inert gas, such as, argon or nitrogen. Solar energy impinging on the collectors 211 is redirected downwardly onto the active surfaces of panels 216 for conversion into electrical energy.

Figure 12:
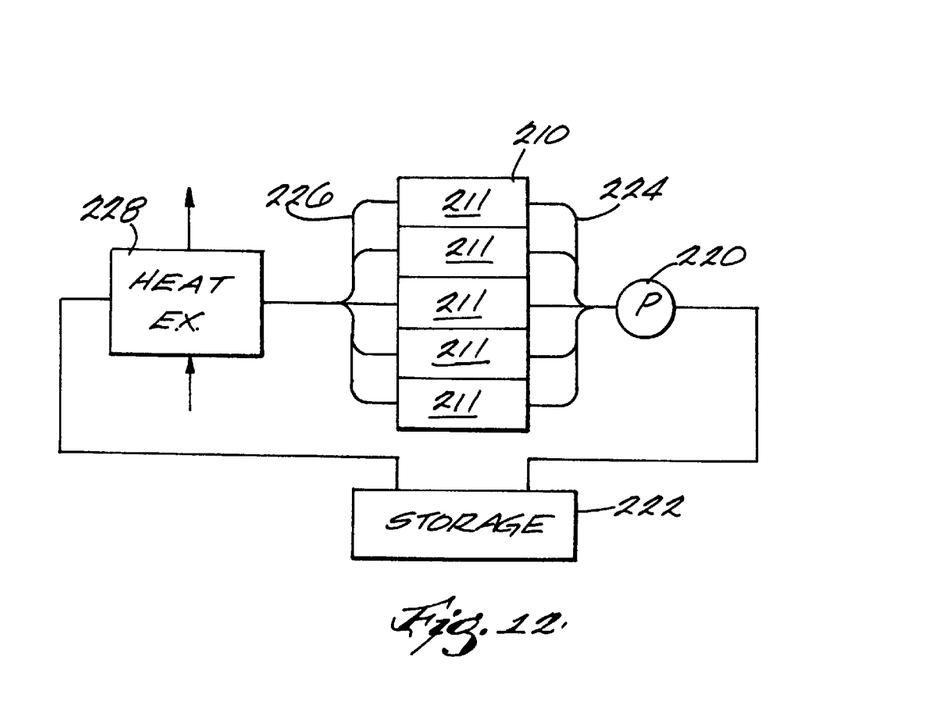

The photovaltaic assembly shown in FIG. 11 may be used not only to convert solar energy to electrical energy, but heat energy as well. Such an installation is shown schematically in FIG. 12. Here, the hollow interior of each of the hollow bodies 211 is connected to a fluid circulation system consisting of a recirculation pump 220 having an inlet connected to a storage container 222 and an outlet connected to a manifold 224. Individual pipes of the manifold 224 are each connected to one end of the chambers formed by the hollow interiors of the housings 211. The opposite ends of each of the chambers is connected by a second manifold 226 to the inlet of a heat exchanger 228. The outlet of the heat exchanger 228 is connected to the storage vessel 222. Any suitable clear fluid, such as water, may be circulated through the hollow bodies 211. Solar energy impacting the arcuate solar energy collectors 214 is not only converted to electrical energy by the photovaltaic panels 212, but also acts to heat the circulating fluid. This heat is extracted by the heat exchanger 228 to provide a source of thermal energy. In this installation, the solar panels 216 may be disposed on the outer surfaces of the sidewalls 212 which would be formed of the same material as the solar collectors 214. While a particular fluid circulation system and a heat exchanger have been disclosed, these are merely intended as examples. Any system for circulating fluid and any device for recovering heat energy from the circulating fluid may be employed.

While only a few embodiments of the invention have been illustrated and described, they are not intended to be limited thereby, but only by the scope of the appended claims.

What is claimed is:

1. A photovoltaic array for receiving solar energy, the array comprising:
    a plurality of aligned solar energy collectors positioned to receive the solar energy, each solar energy collector comprising:
        a light transmissive light collecting body extending in a nominal light source direction and having a first sidewall and a second sidewall, the first and second sidewalls being divergent from each other and positioned at an acute angle relative to the nominal light source direction, both the first sidewall and the second sidewall being light transmissive;
        a solar panel attached to each of the first and second sidewalls, each solar panel including a plurality of generally planar solar cells having an active surface for collecting the solar energy; and
        a solar energy collection surface formed on the light collecting body, the solar energy collection surface being formed to refract the received solar energy onto the active surface of the solar cells attached to the light collecting body.

2. The photovoltaic array of claim 1 wherein the solar energy collection surface includes a plurality of arcuate subsurfaces each formed to direct the received solar energy onto the active surface of the solar cells.

3. The photovoltaic array of claim 2 wherein each of the solar panels is aligned beneath one of the arcuate subsurfaces when viewed along the nominal light source direction.

4. The photovoltaic array of claim 1 wherein the solar energy collection surface extends between the first sidewall and the second sidewall.

5. The photovoltaic array of claim 1 wherein the active surface of each solar cell is positioned in contact with one of the sidewalls of the light collecting body.

6. The photovoltaic array of claim 1 wherein each solar panel attached to the light collecting body is oriented at the same acute angle relative to the nominal light source direction.

7. The photovoltaic array of claim 1 wherein adjacent solar panels of the plurality of aligned solar energy collectors in the photovoltaic array are oriented in intersecting planes and alternate solar panels are oriented in parallel planes.

8. The photovoltaic array of claim 1 wherein the entire light collecting body is light transmissive.

9. The photovoltaic array of claim 1 wherein the solar energy collection surface includes an arcuate subsurface formed to direct the received solar energy onto the active surface of the solar cells.

10. A solar energy collector for receiving solar energy, the solar energy collector comprising:
    a solid light transmissive light collecting body extending in a nominal light source direction and having a first sidewall and a second sidewall, the first and second sidewalls being divergent from each other and positioned at an acute angle relative to the nominal light source direction, both the first sidewall and the second sidewall being light transmissive;
    a solar panel attached to each of the first and second sidewalls, each solar panel including a plurality of generally planar solar cells having an active surface for collecting the solar energy; and
    a solar energy collection surface formed on the light collecting body, the solar energy collection surface being formed to refract the received solar energy onto the active surface of the solar cells attached to the light collecting body.

11. The solar energy collector of claim 10 wherein the solar energy collection surface includes a plurality of arcuate subsurfaces each formed to direct the received solar energy onto the active surface of the solar cells.

12. The solar energy collector of claim 10 wherein each of the solar panels is aligned beneath one of the arcuate subsurfaces when viewed along the nominal light source direction.

13. The solar energy collector of claim 10 wherein the solar energy collection surface extends between the first sidewall and the second sidewall.

14. The solar energy collector of claim 10 wherein the active surface of each solar cell is positioned in contact with one of the sidewalls of the light collecting body.

15. The solar energy collector of claim 10 wherein each solar panel attached to the light collecting body is oriented at the same acute angle relative to the nominal light source direction.

16. The solar energy collector of claim 10 wherein the entire light collecting body is light transmissive.

17. The solar energy collector of claim 10 wherein the solar energy collection surface includes an arcuate subsurface formed to direct the received solar energy onto the active surface of the solar cells.

* * * * *